(12) United States Patent
Qiu et al.

(10) Patent No.: US 8,643,153 B2
(45) Date of Patent: Feb. 4, 2014

(54) SEMICONDUCTOR DEVICE WITH STAGGERED LEADS

(75) Inventors: Shunan Qiu, Tianjin (CN); Zhigang Bai, Tianjin (CN); Xuesong Xu, Tianjin (CN); Beiyue Yan, Tianjin (CN); You Ge, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/461,801

(22) Filed: May 2, 2012

(65) Prior Publication Data

US 2012/0286406 A1 Nov. 15, 2012

(30) Foreign Application Priority Data

May 13, 2011 (CN) .......................... 2011 1 0123304

(51) Int. Cl.
*H01L 23/495* (2006.01)
*H01L 23/48* (2006.01)

(52) U.S. Cl.
USPC .................... 257/666; 257/696; 257/E23.031

(58) Field of Classification Search
USPC .................................. 257/666, 696, E23.031
See application file for complete search history.

(56) References Cited

U.S. PATENT DOCUMENTS

| | | | |
|---|---|---|---|
| 5,397,916 A * | 3/1995 | Normington | 257/686 |
| 5,557,143 A * | 9/1996 | Seiji | 257/666 |
| 5,583,375 A * | 12/1996 | Tsubosaki et al. | 257/692 |
| 6,884,707 B1 * | 4/2005 | Cherian | 438/611 |
| 7,002,240 B2 | 2/2006 | Madrid | |
| 7,838,339 B2 * | 11/2010 | Tsui et al. | 438/123 |
| 2004/0140542 A1 | 7/2004 | Crane | |
| 2004/0232541 A1 * | 11/2004 | Son et al. | 257/696 |
| 2009/0166845 A1 * | 7/2009 | Camacho et al. | 257/696 |

* cited by examiner

*Primary Examiner* — Nitin Parekh
(74) *Attorney, Agent, or Firm* — Charles Bergere (57) ABSTRACT

A process for assembling a semiconductor device includes providing a lead frame having a native plane and a plurality of leads having a native lead pitch. The process includes trimming and forming a first subset of the plurality of leads to provide a first row of leads. The process includes trimming and forming a second subset of the plurality of leads to provide a second row of leads. At least one subset of leads is formed with an obtuse angle relative to the native plane such that lead pitch associated with the first or second subset of leads is greater than the native lead pitch.

10 Claims, 9 Drawing Sheets

SEMICONDUCTOR DEVICE WITH STAGGERED LEADS

BACKGROUND OF THE INVENTION

The present invention relates to semiconductor packaging and more particularly to a semiconductor device having staggered leads and improved lead pitch.

A factor limiting the density of leads (number of leads per unit length) that a semiconductor device such as a quad flat leaded package (QFP) of a given size can contain is lead pitch. Native lead pitch (LP) is essentially the sum of native lead width (LW) plus native spacing between two leads (LS). A wider lead pitch avoids or at least reduces risk of circuit shortage and improves solderability when the semiconductor device is mounted using a surface-mount technology (SMT) process. It also allows wider leads to be formed, which in turn reduces incidence of lead stress and distortion. A narrower lead pitch on the other hand facilitates greater leads density.

Therefore it would be desirable to provide a semiconductor device that has a wider lead pitch without sacrificing leads density.

BRIEF DESCRIPTION OF THE DRAWINGS

The following detailed description of a preferred embodiment of the invention will be better understood when read in conjunction with the appended drawings. The present invention is illustrated by way of example and is not limited by the accompanying figures in which like references indicate similar elements. It is to be understood that the drawings are not to scale and have been simplified for ease of understanding the invention

DETAILED DESCRIPTION OF THE INVENTION

According to one aspect of the present invention there is provided a process for assembling a semiconductor device comprising: providing a lead frame having a native plane and a plurality of leads having a native lead pitch; trimming and forming a first subset of said plurality of leads to provide a first row of leads; and trimming and forming a second subset of said plurality of leads to provide a second row of leads, wherein at least one subset of leads is formed with an obtuse angle relative to said native plane such that lead pitch associated with said first or second subset of leads is greater than said native lead pitch.

The process may further include trimming and forming a third subset of the plurality of leads to provide a third row of leads such that lead pitch associated with the third subset of leads is greater than the native lead pitch.

The first subset of leads may be trimmed to a first length and the second subset of leads may be trimmed to a second length shorter than the first length. In a preferred form the lead pitch associated with the formed leads may be substantially double the native lead pitch. The first and second subsets of leads may be formed with respective first and second obtuse angles relative to the native plane.

The first subset of leads may be formed with an acute angle relative to the native plane. The acute angle preferably is in the range from 70 to 90 degrees and in one form may be about 80 degrees. The first subset of leads may be trimmed to a first length and the second subset of leads may be trimmed to a second length longer than the first length.

The first subset of leads may be formed with an obtuse angle relative to the native plane. The obtuse angle preferably is in the range from 90 to 135 degrees and in one form may be about 120 degrees. The width of each lead may be substantially in the range NLW to NLP-M mm wherein NLW denotes native lead width, NLP denotes native lead pitch and M denotes a minimum margin between leads. Due to current capability of lead frame manufacturers the minimum preferred margin M is about 0.1 mm. In one form the width of each lead may be about 0.3 mm. The width of each lead may be greater at its tip than along its length.

The present invention also provides a semiconductor device comprising: a lead frame including a native plane and a plurality of leads having a native lead pitch; a first subset of said plurality of leads wherein said first subset of leads is trimmed and formed to a first row of leads; and a second subset of said plurality of leads wherein said second subset of leads is trimmed and formed to a second row of leads, wherein at least one subset of leads is formed with an obtuse angle relative to said native plane such that lead pitch associated with said first or second row of leads is greater than said native lead pitch.

FIGS. 1a-1d shows a conventional QFP semiconductor device. A typical lead width (LW) for the QFP package is 0.16 mm. With a typical lead spacing (LS) of about 0.24 mm the lead pitch (LP) of the conventional package is about 0.16+0.24=0.4 mm.

An improved QFP device according to one embodiment of the present invention is shown in FIGS. 2a-2d. A typical lead width (LW) for the improved package is 0.3 mm which is about double (×1.88) the lead width shown in the prior art package of FIG. 1. A typical lead spacing (LS) for the improved package is 0.5 mm which is also about double (×2.08) the lead spacing shown in the conventional package of FIG. 1. This gives a typical lead pitch (LP) for the improved package of 0.3+0.5=0.8 mm which is double the lead pitch shown in the prior art package of FIG. 1. The wider lead pitch better resists incidence of circuit shortage in an SMT process. Meanwhile the larger lead width reduces lead stress and avoids lead distortion. These factors lead to overall improved solderability of the QFP package shown in FIGS. 2a-2d compared to the conventional packaged device shown in FIGS. 1a-1d.

Wider lead pitch in the revised QFP is achieved by forming the tips or feet of the leads into at least two staggered rows, namely a first or outer row 20 and a second or inner row 21 as shown in FIGS. 2a to 2d. A trim and form process for manufacturing a QFP device as shown in FIGS. 2a-2d is described below with reference to FIGS. 3 to 10.

Figure 1A:
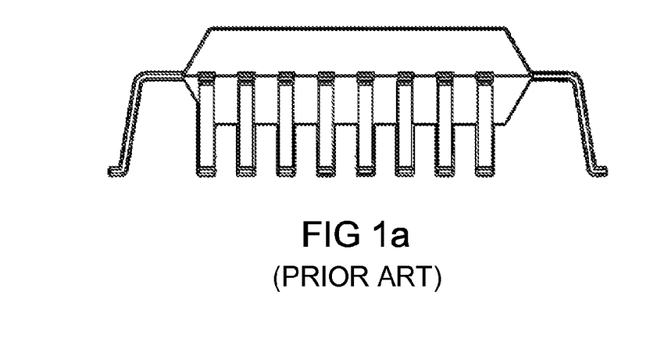
FIGS. 1a-1d show a conventional QFP semiconductor package.
Figure 1B:
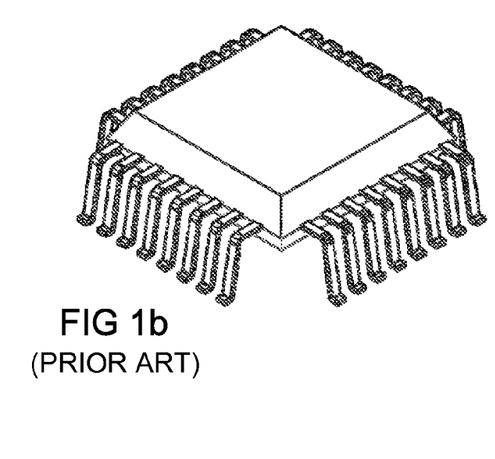
Figure 1C:
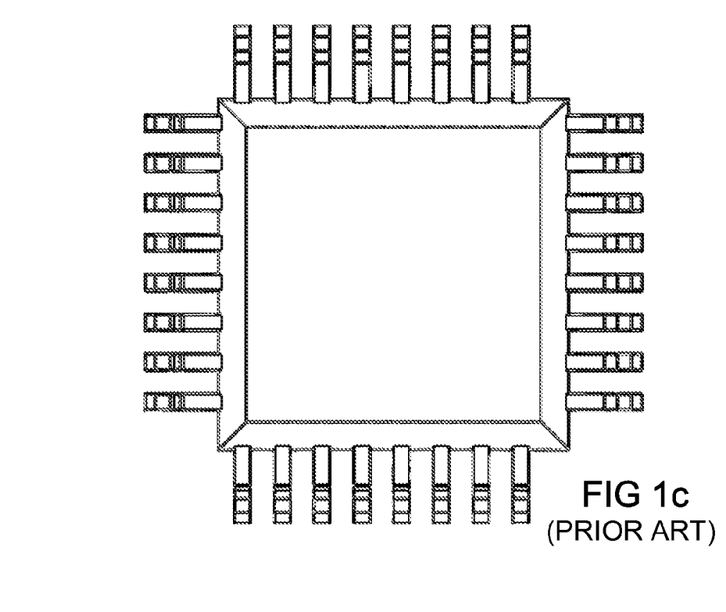
Figure 1D:
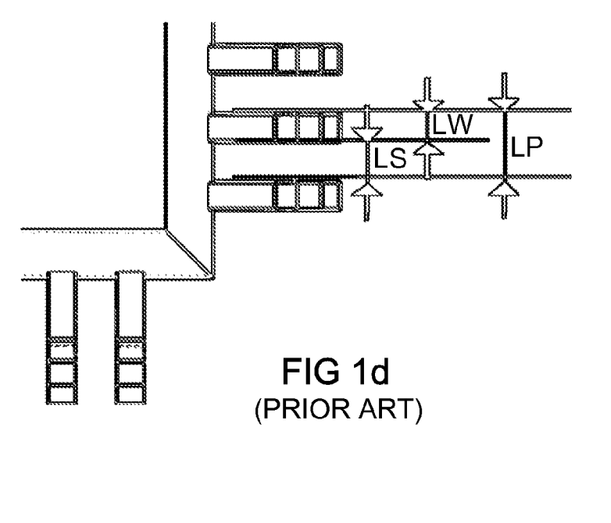
Figures 2A, 2B:
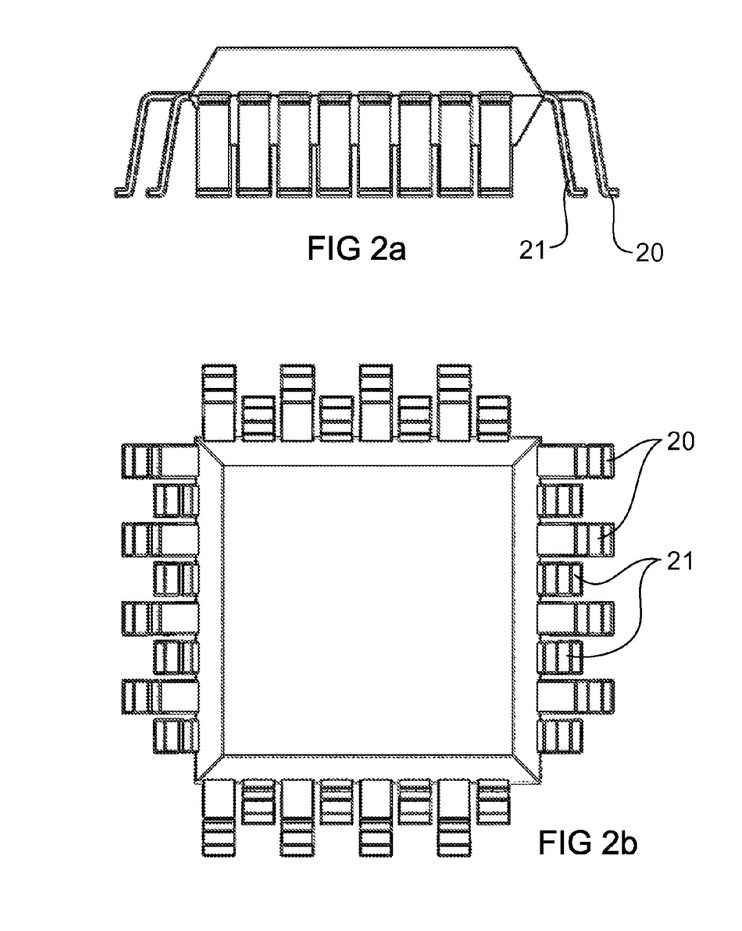
FIGS. 2a-2d show a QFP package according to one embodiment of the present invention.
Figure 2C:
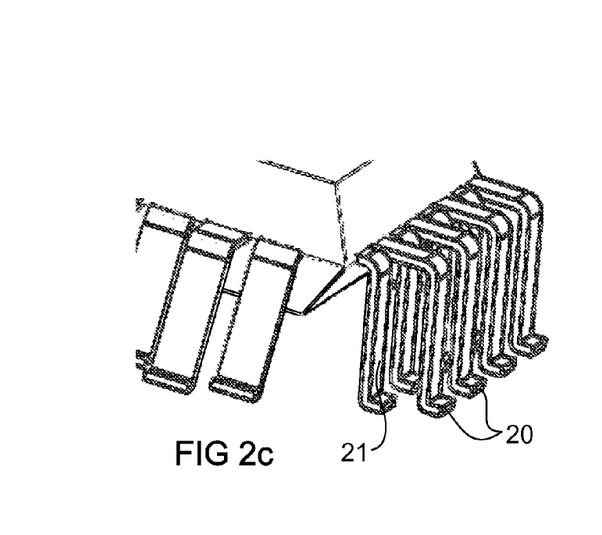
Figure 2D:
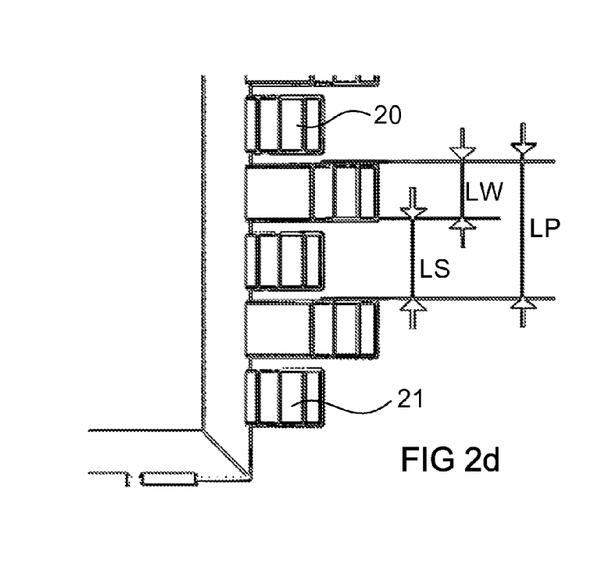
Figure 3:
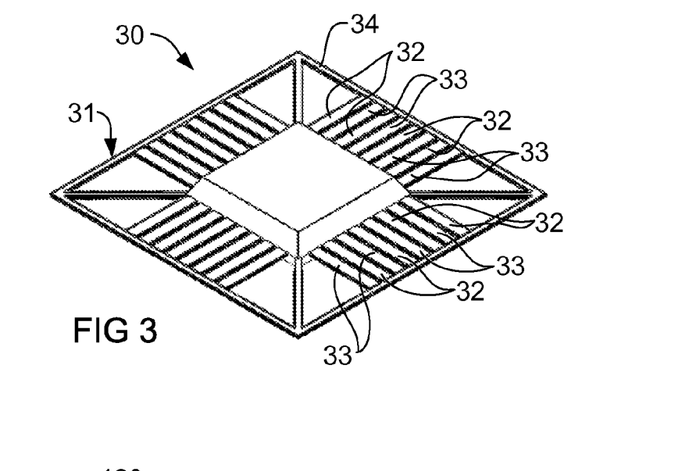
FIG. 3 shows a semiconductor device and lead frame in accordance with an embodiment of the present invention before being trimmed and formed.

FIG. 3 shows a semiconductor device 30 before undergoing a trim and form process. The semiconductor device 30 comprises lead frame 31 including a native plane defined by unformed leads, a plurality of first or outer leads 32, a plurality of second or inner leads 33 and a tie bar 34. The lead frame 31 has increased lead width compared to the prior art semiconductor package shown in FIGS. 1a-1d.

Figure 4A:
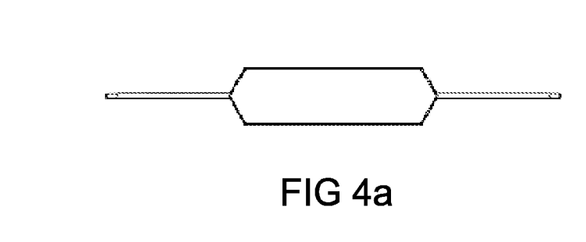
FIGS. 4a-4b show the semiconductor device of FIG. 3 with a first row of leads after being trimmed.
Figure 4B:
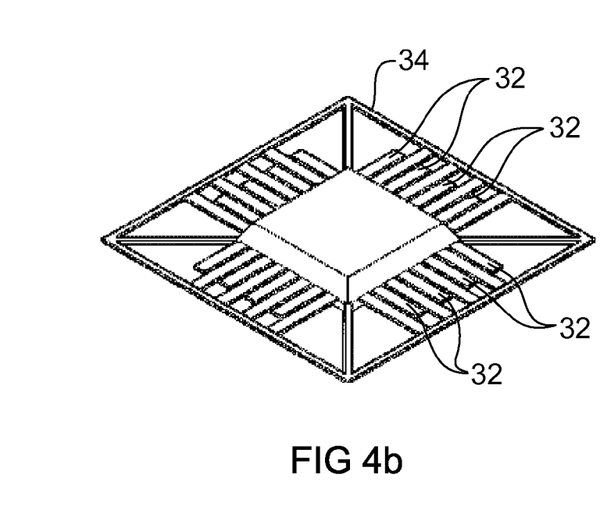
Figure 5A:
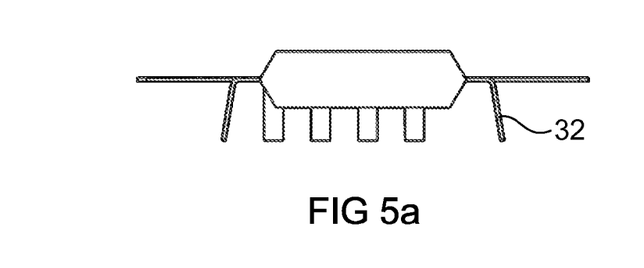
FIGS. 5a-5b show the semiconductor device of FIG. 4 with the first row of leads after being formed.
Figure 5B:
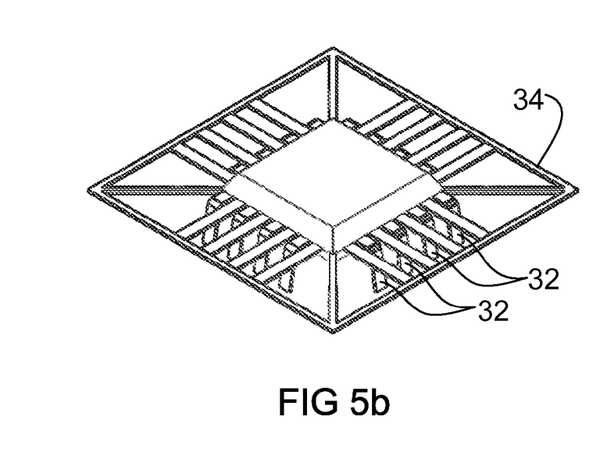
Figure 6A:
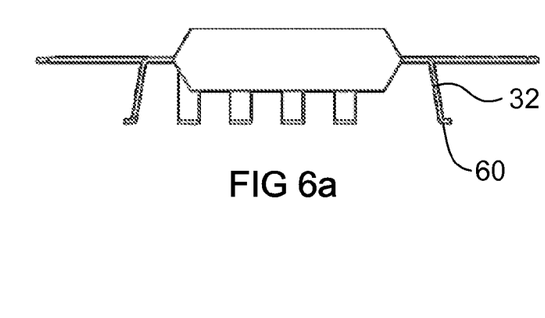
FIGS. 6a-6b show the semiconductor device of FIG. 5 with tips of the first row of leads after being formed.
Figure 6B:
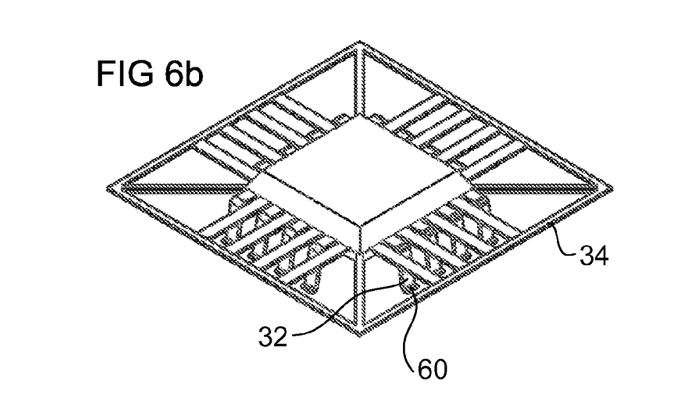

FIGS. 4a-4b show the first or outer row of leads 32 after being trimmed to a first length and FIGS. 5a-5b show the first or outer row of leads 32 after being formed to an acute angle relative to the native plane of the unformed leads. FIGS. 6a-6b show the first or outer row of leads 32 after being formed with tips 60.

Figure 7A:
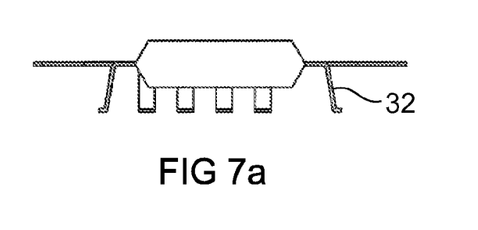
FIGS. 7a-7b show the semiconductor device of FIG. 6 with a second row of leads after being trimmed.
Figure 7B:
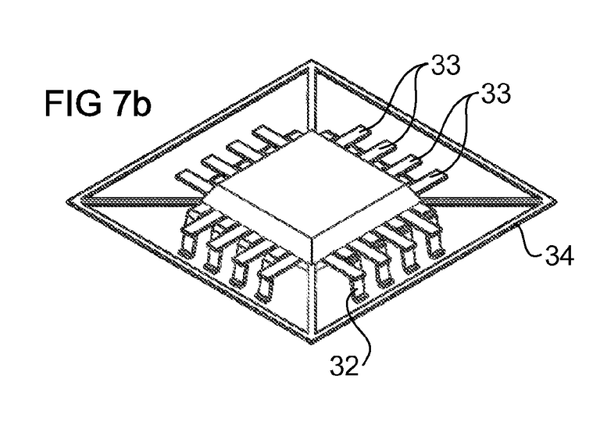
Figure 8A:
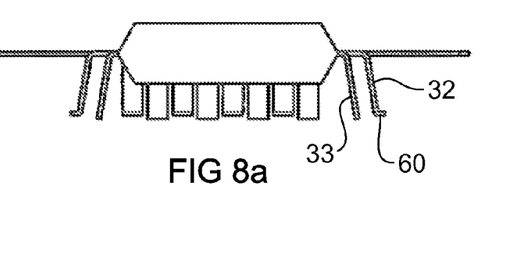
FIGS. 8a-8b show the semiconductor device of FIG. 7 with the second row of leads after being formed.
Figure 8B:
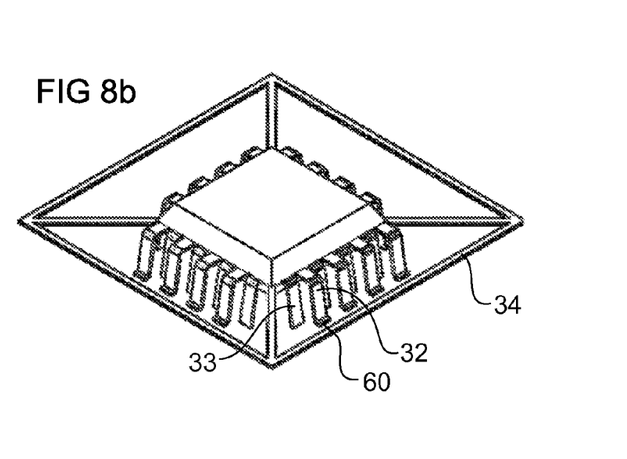
Figure 9A:
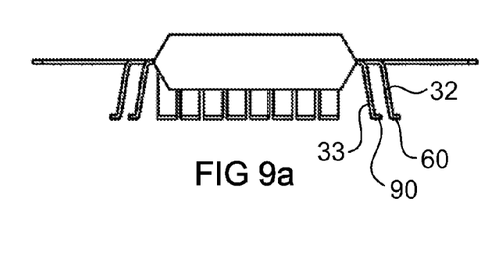
FIGS. 9a-9b show the semiconductor device of FIG. 8 with the tips of the second row of leads after being formed.
Figure 9B:
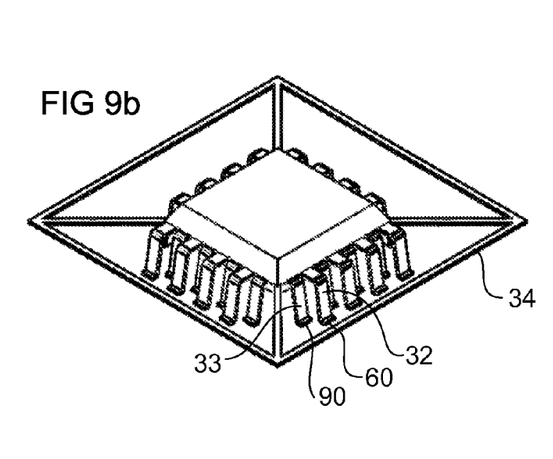

FIGS. 7a-7b show a second or inner row of leads 33 after being trimmed to a second length and FIGS. 8a-8b show the second or inner row of leads 33 after being formed to an acute angle relative to the native plane. FIGS. 9a-9b show the second or inner row of leads 32 after being formed with tips 90.

Figure 10A:
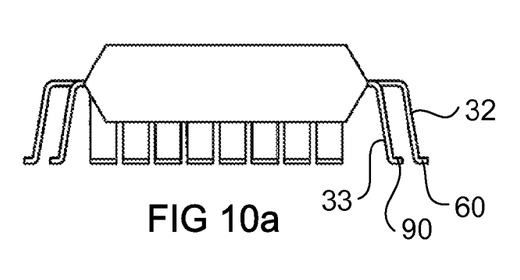
FIGS. 10a-10b show a completed semiconductor device in accordance with an embodiment of the present invention.
Figure 10B:
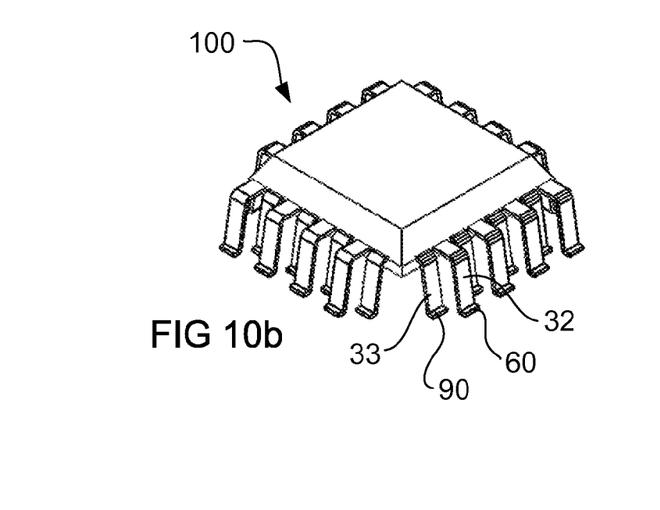

FIGS. 10a-10b show a completed semiconductor device 100 in respective side and isometric views after trimming of the tie bar 34.

Figure 11A:
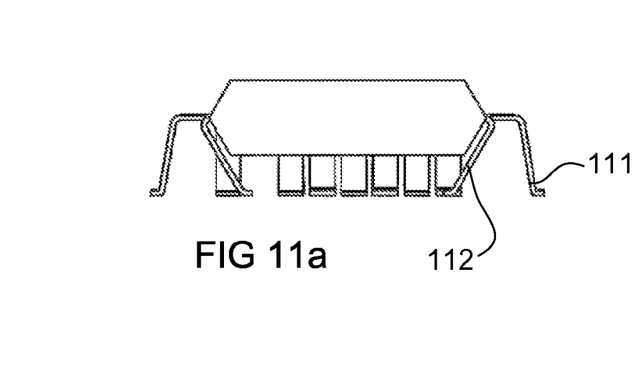
FIGS. 11a-11b show a further semiconductor device according to an embodiment of the present invention.
Figure 11B:
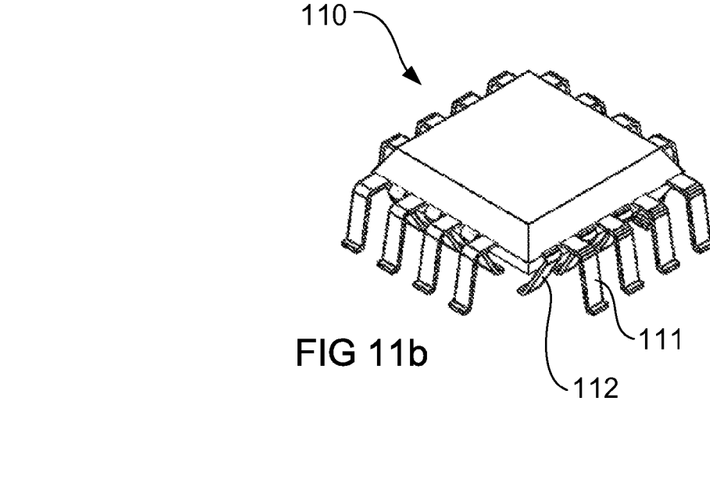

FIGS. 11a-11b show a semiconductor device 110 according to the present invention wherein the outer row of leads 111 is formed with an acute angle of about 80 degrees relative to the native plane. Leads 111 are comparable to outer row of leads 32 in the embodiment described with reference to FIGS. 3-10. The inner rows of lead 112 is formed and turned with an obtuse angle of about 120 degrees relative to the native plane instead of being formed with an acute angle as was the case with the inner row of leads 33 in the embodiment described with reference to FIGS. 3-10.

Figure 12A:
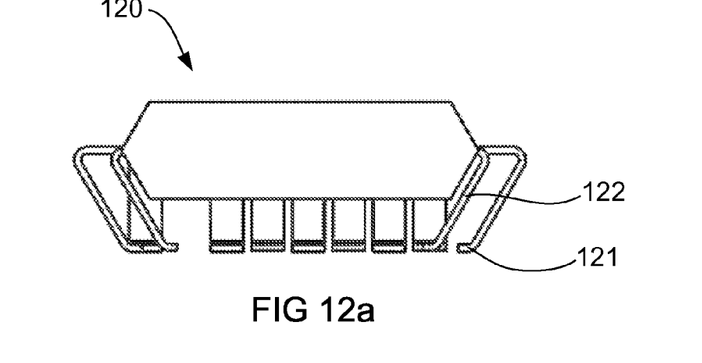
FIGS. 12a-12b show a still further semiconductor device according to the present invention.
Figure 12B:
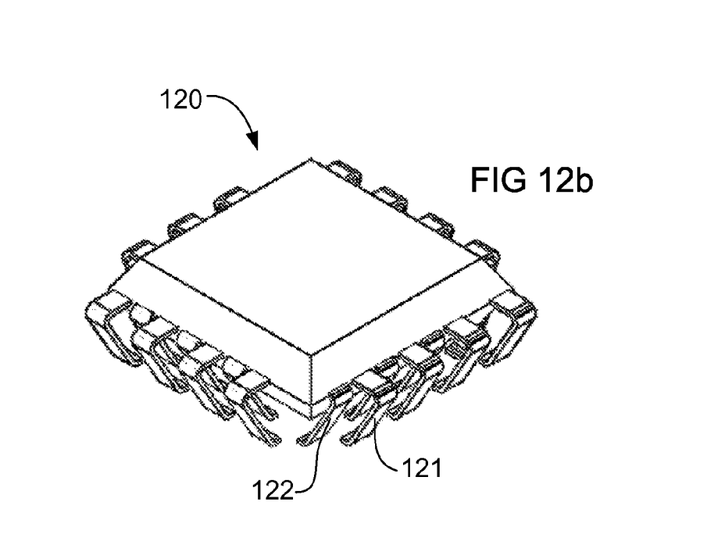

FIGS. 12a-12b show a further semiconductor device 120 according to the present invention where the outer rows of leads 121 and the inner rows of leads 122 are formed and turned with respective first and second obtuse angles relative to the native plane instead of being formed with acute angles as was the case in the embodiment described with reference to FIGS. 3-10.

FIGS. 13a-13d show a still further semiconductor device 130 according to the present invention wherein two rows of outer leads 131, 132 are formed with acute angles and two rows of inner leads 133, 134 are formed and turned with acute angles relative to the native plane.

Figures 13A, 13B, 13C, 13D:
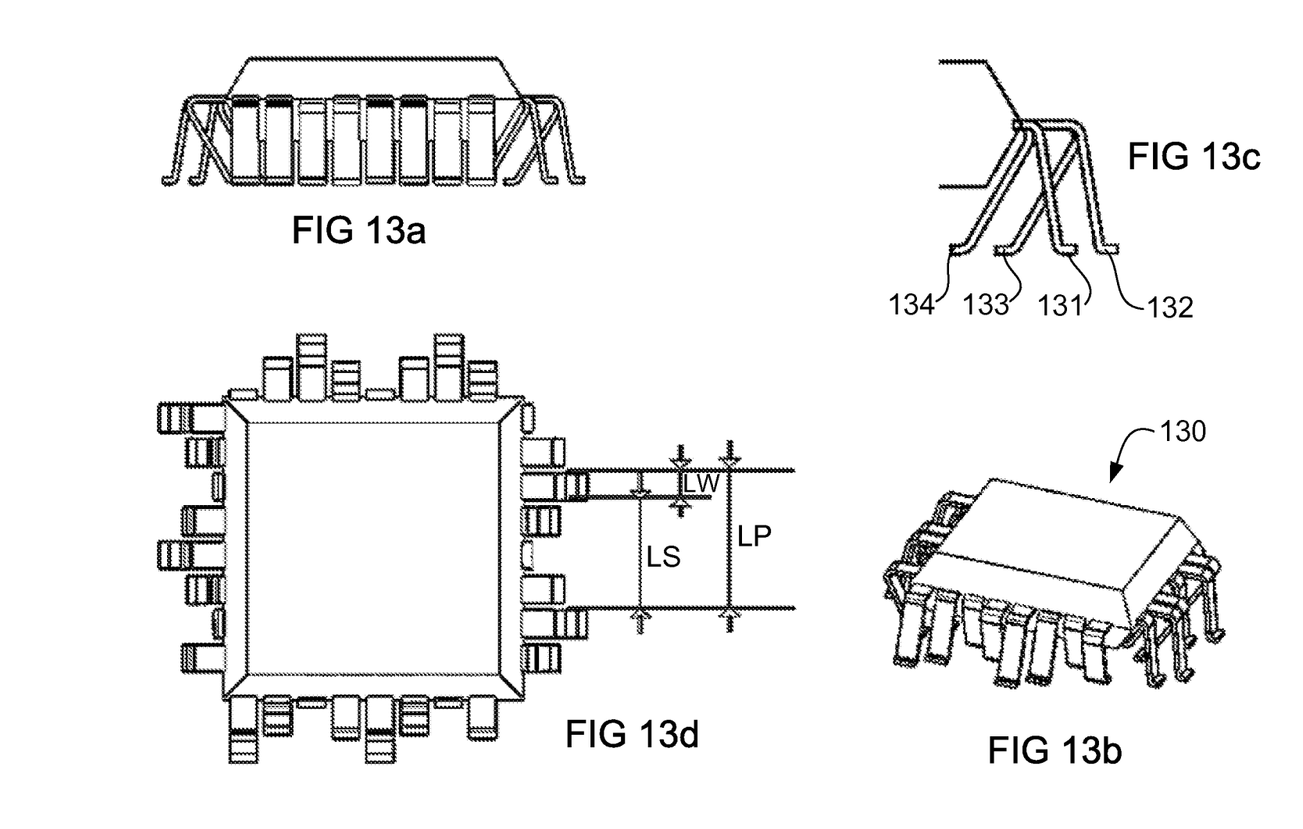
FIGS. 13a-13d show a still further semiconductor package according to the present invention.

Other combinations of inner and outer rows of leads may be formed and turned employing the same or similar concepts which in a general case may encompass N-rows of leads (N>2) in which different subsets of leads are trimmed to short or long leads and/or are formed to acute angles and/or turned and formed to obtuse angles such that adjacent leads are separated into respective rows whereby lead pitch associated with a given row or subset of leads is increased for improved solderability. For example lead 131 in FIG. 13c represents short leads formed with acute angles and lead 132 represents long leads formed with acute angles. Lead 133 represents long leads formed and turned with obtuse angles and lead 134 represents short leads formed and turned with obtuse angles.

As with the embodiment of FIGS. 3-10, the further embodiments shown in FIGS. 11-13 improve solderability due to adjacent leads being separated into multiple rows in respective trim and form processes, each with increased lead pitch (LP) eg. as shown in FIG. 13d.

Figure 14A:
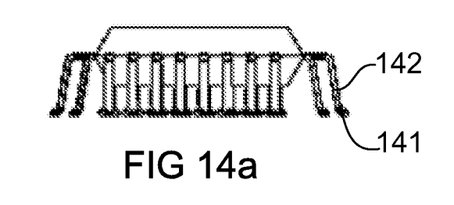
FIGS. 14a-14c show a variation of the semiconductor device of FIG. 10.
Figure 14B:
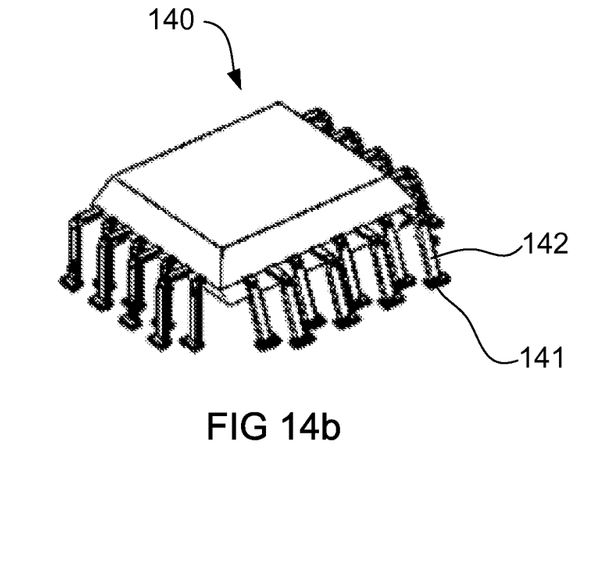
Figure 14C:
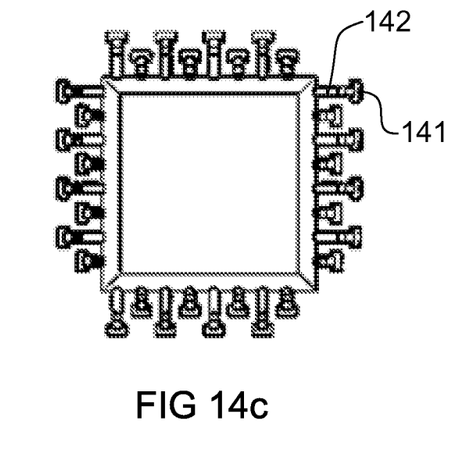

FIGS. 14a-14c, show a further variation of the embodiment of a semiconductor QFP package 140 wherein the tips 141 of inner and outer leads 142 are wider than prior art leads. Other than the tips 141 the width of the rest of each lead 142 is comparable to lead widths shown in prior art such as FIGS. 1a-1d. The embodiment shown in FIGS. 14a-14c may be adopted in circumstances in which enhanced lead density is desired without sacrificing tip width.

As is evident from the foregoing discussion the present invention provides a method of producing a semiconductor device having staggered leads with improved lead pitch. While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as defined in the claims.

The invention claimed is:
1. A semiconductor device, comprising:
 a lead frame including a native plane and a plurality of leads having a native lead pitch;
 a first subset of said plurality of leads that is trimmed and formed to a first row of leads; and
 a second subset of said plurality of leads that is trimmed and formed to a second row of leads;
 wherein the first subset of leads is formed with an obtuse angle relative to said native plane, and the second subset of leads is formed with an acute angle relative to said native plane, such that lead pitch associated with said first or second row of leads is greater than said native lead pitch.
2. The semiconductor device of claim 1, wherein said native lead pitch is equal to the sum of native lead width plus native lead spacing.
3. The semiconductor device of claim 1, further comprising:
 a third subset of said plurality of leads wherein said third subset of leads is formed to provide a third row of leads such that lead pitch associated with said third row of leads is greater than said native lead pitch.
4. The semiconductor device of claim 3, wherein said second and third subsets of leads are formed with respective first and second acute angles relative to said native plane.
5. The semiconductor device of claim 3, wherein said first and third subsets of leads are formed with respective first and second obtuse angles relative to said native plane.
6. The semiconductor device of claim 1, wherein said first subset of leads is trimmed to a first length and said second subset of leads is trimmed to a second length shorter than said first length.
7. The semiconductor device of claim 1, wherein said lead pitch associated with said first or second row of formed leads is substantially double said native lead pitch.
8. The semiconductor device of claim 1, wherein said first subset of leads is trimmed to a first length and said second subset of leads is trimmed to a second length longer than said first length.
9. The semiconductor device of claim 1, wherein width of each lead is substantially in the range of NLW to NLP-M mm wherein NLW denotes native lead width, NLP denotes native lead pitch and M denotes a minimum margin between leads.

10. The semiconductor device of claim 1, wherein the width of each lead is greater at its tip than along its length.

* * * * *